United States Patent
Jacobs et al.

(10) Patent No.: US 8,705,009 B2
(45) Date of Patent: Apr. 22, 2014

(54) HEAT PIPE, LITHOGRAPHIC APPARATUS AND DEVICE MANUFACTURING METHOD

(75) Inventors: Johannes Henricus Wilhelmus Jacobs, Heeze (NL); Nicolaas Ten Kate, Almkerk (NL); Joost Jeroen Ottens, Veldhoven (NL); Gerrit Van Donk, Vollenhove (NL); Johannes Van Es, Zwolle (NL)

(73) Assignee: ASML Netherlands B.V., Veldhoven (NL)

( * ) Notice: Subject to any disclaimer, the term of this patent is extended or adjusted under 35 U.S.C. 154(b) by 650 days.

(21) Appl. No.: 12/891,375

(22) Filed: Sep. 27, 2010

(65) Prior Publication Data

US 2011/0075118 A1    Mar. 31, 2011

Related U.S. Application Data

(60) Provisional application No. 61/246,268, filed on Sep. 28, 2009, provisional application No. 61/296,118, filed on Jan. 19, 2010.

(51) Int. Cl.
  *G03B 27/58* (2006.01)
  *G03B 27/52* (2006.01)
  *G03B 27/42* (2006.01)

(52) U.S. Cl.
  USPC .................................. 355/72; 355/30; 355/53

(58) Field of Classification Search
  USPC ......................................... 355/30, 53, 72, 77
  See application file for complete search history.

(56) References Cited

U.S. PATENT DOCUMENTS

| | | |
|---|---|---|
| 3,573,975 A | 4/1971 | Dhaka et al. |
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 4,534,312 A | 8/1985 | Shinya et al. |
| 4,880,053 A | 11/1989 | Sheyman |
| 5,025,133 A | 6/1991 | Tsutara et al. |
| 5,040,020 A | 8/1991 | Rauschenbach et al. |
| 5,121,256 A | 6/1992 | Corle et al. |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

T. Adamek, "Bestimmung der Kondesationgroessen auf feingewellten Oberflaechen zur Auslegung optimaler Wandprofile," Heat and Mass Transfer, vol. 15, No. 4, pp. 255-270 (1981).

(Continued)

*Primary Examiner* — Peter B Kim
(74) *Attorney, Agent, or Firm* — Pillsbury Winthrop Shaw Pittman LLP

(57) ABSTRACT

A lithographic apparatus is provided that includes a substrate holder configured to hold a substrate, and a heat pipe to maintain the substrate holder at a substantially uniform temperature. The heat pipe has a chamber containing a liquid reservoir and a vapor space, and a heating element at least partly in contact with liquid in the chamber.

20 Claims, 10 Drawing Sheets

(56) References Cited

U.S. PATENT DOCUMENTS

| | | |
|---|---|---|
| 5,610,683 A | 3/1997 | Takahashi |
| 5,769,154 A | 6/1998 | Adkins et al. |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. |
| 6,392,738 B1 | 5/2002 | Van De Pasch et al. |
| 6,600,547 B2 | 7/2003 | Watson et al. |
| 6,603,130 B1 | 8/2003 | Bisschops et al. |
| 6,666,261 B2 | 12/2003 | Yang et al. |
| 7,106,416 B2 | 9/2006 | Box et al. |
| 7,304,715 B2 | 12/2007 | Cadee et al. |
| 7,652,746 B2 | 1/2010 | Jacobs et al. |
| 7,733,459 B2 | 6/2010 | Dierichs et al. |
| 7,751,027 B2 * | 7/2010 | Jacobs et al. .................. 355/30 |
| 7,916,272 B2 | 3/2011 | Kameyama |
| 2002/0020821 A1 | 2/2002 | Van Santen et al. |
| 2002/0088608 A1 | 7/2002 | Park |
| 2002/0139523 A1 | 10/2002 | Hsai |
| 2002/0163629 A1 | 11/2002 | Switkes et al. |
| 2002/0166655 A1 | 11/2002 | Sugito et al. |
| 2003/0123040 A1 | 7/2003 | Almogy |
| 2003/0228772 A1 | 12/2003 | Cowans |
| 2004/0000627 A1 | 1/2004 | Schuster |
| 2004/0075895 A1 | 4/2004 | Lin |
| 2004/0114117 A1 | 6/2004 | Bleeker |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0207824 A1 | 10/2004 | Lof et al. |
| 2004/0211920 A1 | 10/2004 | Derksen et al. |
| 2004/0239954 A1 | 12/2004 | Bischoff |
| 2004/0257544 A1 | 12/2004 | Vogel et al. |
| 2004/0263809 A1 | 12/2004 | Nakano |
| 2005/0007569 A1 | 1/2005 | Streefkerk et al. |
| 2005/0018155 A1 | 1/2005 | Cox et al. |
| 2005/0024609 A1 | 2/2005 | De Smit et al. |
| 2005/0030497 A1 | 2/2005 | Nakamura |
| 2005/0046813 A1 | 3/2005 | Streefkerk et al. |
| 2005/0046934 A1 | 3/2005 | Ho et al. |
| 2005/0052632 A1 | 3/2005 | Miyajima |
| 2005/0068499 A1 | 3/2005 | Dodoc et al. |
| 2005/0078286 A1 | 4/2005 | Dierichs et al. |
| 2005/0094116 A1 | 5/2005 | Flagello et al. |
| 2005/0094125 A1 | 5/2005 | Arai |
| 2005/0122505 A1 | 6/2005 | Miyajima |
| 2005/0128448 A1 | 6/2005 | Box et al. |
| 2005/0132914 A1 | 6/2005 | Mulkens et al. |
| 2005/0134817 A1 | 6/2005 | Nakamura |
| 2005/0140948 A1 | 6/2005 | Tokita |
| 2005/0146693 A1 | 7/2005 | Ohsaki |
| 2005/0146694 A1 | 7/2005 | Tokita |
| 2005/0151942 A1 | 7/2005 | Kawashima |
| 2005/0200815 A1 | 9/2005 | Akamatsu |
| 2005/0213065 A1 | 9/2005 | Kitaoka |
| 2005/0213066 A1 | 9/2005 | Sumiyoshi |
| 2005/0219489 A1 | 10/2005 | Nei et al. |
| 2005/0233081 A1 | 10/2005 | Tokita |
| 2005/0275821 A1 | 12/2005 | Miyajima |
| 2006/0033892 A1 | 2/2006 | Cadee et al. |
| 2006/0033898 A1 | 2/2006 | Cadee et al. |
| 2006/0038968 A1 | 2/2006 | Kemper et al. |
| 2006/0102849 A1 | 5/2006 | Mertens et al. |
| 2006/0119809 A1 | 6/2006 | Verhagen et al. |
| 2006/0131733 A1 | 6/2006 | Mongia et al. |
| 2006/0158627 A1 | 7/2006 | Kemper et al. |
| 2006/0285093 A1 | 12/2006 | Hara et al. |
| 2006/0285096 A1 | 12/2006 | Jacobs et al. |
| 2007/0004232 A1 | 1/2007 | Shareef et al. |
| 2007/0056714 A1 | 3/2007 | Wong |
| 2007/0070315 A1 | 3/2007 | Jacobs et al. |
| 2008/0066894 A1 | 3/2008 | Valenzuela |
| 2008/0174963 A1 | 7/2008 | Chang et al. |
| 2008/0212046 A1 | 9/2008 | Riepen et al. |
| 2008/0254468 A1 | 10/2008 | Glauser |
| 2010/0060868 A1 | 3/2010 | Tanasa et al. |
| 2010/0245791 A1 | 9/2010 | Jacobs et al. |
| 2011/0232878 A1 | 9/2011 | Jacobs et al. |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1420300 A2 | 5/2004 |
| FR | 2474708 | 7/1981 |
| JP | 58-202448 | 11/1983 |
| JP | 61-093391 | 5/1986 |
| JP | 61-190291 | 8/1986 |
| JP | 62-065326 | 3/1987 |
| JP | 62-121417 | 6/1987 |
| JP | 63-157419 | 6/1988 |
| JP | 01-145300 | 6/1989 |
| JP | 04-305915 | 10/1992 |
| JP | 04-305917 | 10/1992 |
| JP | 06-124873 | 5/1994 |
| JP | 07-132262 | 5/1995 |
| JP | 07-505703 | 6/1995 |
| JP | 07-220990 | 8/1995 |
| JP | 10-228661 | 8/1998 |
| JP | 10-255319 | 9/1998 |
| JP | 10-303114 | 11/1998 |
| JP | 10-339591 | 12/1998 |
| JP | 10-340846 | 12/1998 |
| JP | 11-176727 | 7/1999 |
| JP | 2000-058436 | 2/2000 |
| JP | 2001-021281 | 1/2001 |
| JP | 2001-091849 | 4/2001 |
| JP | 2002-318085 | 10/2002 |
| JP | 2004-174963 | 6/2004 |
| JP | 2004-193252 | 7/2004 |
| JP | 2005-252247 | 9/2005 |
| JP | 2006-054468 | 2/2006 |
| JP | 2006-281696 | 10/2006 |
| JP | 2007-005362 | 1/2007 |
| JP | 2007-005795 | 1/2007 |
| TW | 200510923 | 3/2005 |
| WO | 99/49504 | 9/1999 |
| WO | 2004/053596 A2 | 6/2004 |
| WO | 2004/053950 A1 | 6/2004 |
| WO | 2004/053951 A1 | 6/2004 |
| WO | 2004/053952 A1 | 6/2004 |
| WO | 2004/053953 A1 | 6/2004 |
| WO | 2004/053954 A1 | 6/2004 |
| WO | 2004/053955 A1 | 6/2004 |
| WO | 2004/053956 A1 | 6/2004 |
| WO | 2004/053957 A1 | 6/2004 |
| WO | 2004/053958 A1 | 6/2004 |
| WO | 2004/053959 A1 | 6/2004 |
| WO | 2004/055803 A1 | 7/2004 |
| WO | 2004/057589 A1 | 7/2004 |
| WO | 2004/057590 A1 | 7/2004 |
| WO | 2004/086470 | 10/2004 |
| WO | 2004/090577 | 10/2004 |
| WO | 2004/090633 | 10/2004 |
| WO | 2004/090634 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004/093160 | 10/2004 |
| WO | 2004/095135 | 11/2004 |
| WO | 2005/010611 | 2/2005 |
| WO | 2005/024517 | 3/2005 |
| WO | 2005/064405 | 7/2005 |
| WO | 2006-101120 | 9/2006 |
| WO | 2006093340 | 9/2006 |

OTHER PUBLICATIONS

M. Switkes et al., "Immersion Lithography at 157 nm", MIT Lincoln Lab, Orlando 2001-1, Dec. 17, 2001.

(56) References Cited

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.

G. Owen et al., "1/8 µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

European Search Report for Application No. EP 06 25 3116 dated Oct. 24, 2006.

U.S. Office Action dated Jun. 10, 2013 in corresponding U.S Appl. No. 12/891,354.

U.S. Office Action dated Sep. 12, 2013 in corresponding U.S Appl. No. 12/891,354.

\* cited by examiner

HEAT PIPE, LITHOGRAPHIC APPARATUS AND DEVICE MANUFACTURING METHOD

This application claims priority and benefit under 35 U.S.C. §119(e) to U.S. Provisional Patent Application No. 61/246,268, entitled "Heat Pipe, Lithographic Apparatus and Device Manufacturing Method", filed on Sep. 28, 2009 and to U.S. Provisional Patent Application No. 61/296,118, entitled "Heat Pipe, Lithographic Apparatus and Device Manufacturing Method", filed on Jan. 19, 2010. The content of each of the foregoing applications is incorporated herein in its entirety by reference.

FIELD

The present invention relates to a heat pipe, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

Another arrangement is an all wet arrangement in which the immersion liquid is unconfined as disclosed in PCT patent application publication WO 2005/064405. In such a system, the immersion liquid is unconfined. The whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table may be moved away from its exposure position to a position in which the substrate may be removed and replaced by a different substrate. This is known as substrate swap. In a two stage lithographic apparatus, a swap of the tables may take place under the projection system.

In an immersion apparatus, immersion liquid is handled by a fluid handling system or apparatus, for example a fluid handling structure. A fluid handling system may supply immersion fluid and therefore be a fluid supply system. A fluid handling system may at least partly confine fluid and thereby be a fluid confinement system. A fluid handling system may provide a barrier to fluid and thereby be a barrier member. Such a barrier member may be a fluid confinement structure. A fluid handling system may create or use a flow of fluid (such as gas), for example to help in handling liquid, e.g. in controlling the flow and/or the position of the immersion fluid. The flow of gas may form a seal to confine the immersion fluid so the fluid handling structure may be referred to as a seal member; such a seal member may be a fluid confinement structure. Immersion liquid may be used as the immersion fluid. In that case, the fluid handling system may be a liquid handling system. The fluid handling system may be located between the projection system and the substrate table. In reference to the aforementioned description, reference in this paragraph to a feature defined with respect to fluid may be understood to include a feature defined with respect to liquid.

SUMMARY

The presence of liquid and/or gas flows on a substrate in a lithographic apparatus can lead to localized cooling, e.g. by evaporation. This may undesirably lead to a non-uniform temperature on the surface of the substrate being imaged (e.g. in plan). This may lead to undesirable defects, for example overlay defects.

It is desirable, for example, to provide a system to mitigate against non-uniform cooling of an object such that the object is maintained at a substantially uniform temperature.

According to an aspect, there is provided a lithographic apparatus comprising a substrate holder configured to hold a substrate; and a heat pipe configured to maintain the substrate holder at a substantially uniform temperature, the heat pipe comprising: a chamber containing a liquid reservoir and a vapor space; and a heating element at least partly in contact, in use, with liquid in the chamber.

According to an aspect, there is provided a heat pipe to maintain an object at a substantially uniform temperature, comprising: a chamber containing a liquid reservoir and a vapor space, part of the chamber being defined by a condensing surface; a liquid transporter configured to apply a force to a liquid to transport liquid away from the condensing surface towards the reservoir; and a heating element configured to heat liquid, the heating element being positioned in the liquid transporter.

According to an aspect, there is provided a heat pipe to maintain an object at a substantially uniform temperature, comprising: a chamber containing a liquid reservoir and a vapor space; and a heating element configured to heat liquid in the reservoir and positioned partly in the reservoir and partly in the vapor space.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
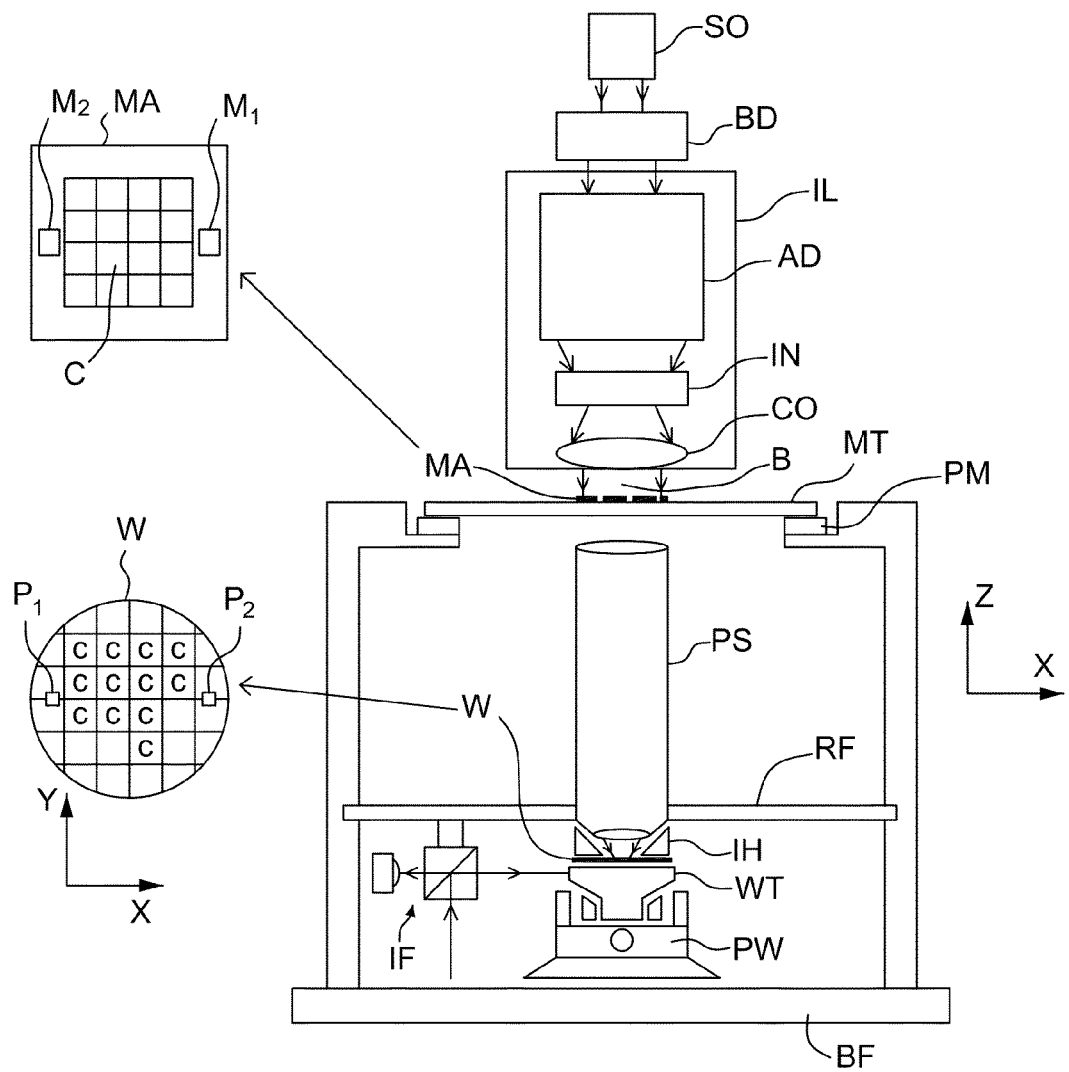
FIG. 1 depicts a lithographic apparatus according to an embodiment of the invention.

FIG. 1 schematically depicts a lithographic apparatus according to one embodiment of the invention. The apparatus comprises:
  an illumination system (illuminator) IL configured to condition a radiation beam B (e.g. UV radiation or DUV radiation).
  a support structure (e.g. a mask table) MT constructed to support a patterning device (e.g. a mask) MA and connected to a first positioner PM configured to accurately position the patterning device MA in accordance with certain parameters;
  a substrate table (e.g. a wafer table) WT constructed to hold a substrate (e.g. a resist-coated wafer) W and connected to a second positioner PW configured to accurately position the substrate W in accordance with certain parameters; and
  a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT hold the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the allwet immersion system. In the bath type arrangement substantially the whole of the substrate W and optionally part of the substrate table WT is submersed in a bath of liquid.

The localized immersion system uses a liquid supply system in which liquid is only provided to a localized area of the substrate. The space filled by liquid is smaller in plan than the top surface of the substrate. The volume or space filled with liquid remains substantially stationary relative to the projection system PS while the substrate W moves underneath that area. FIGS. 2-5 show different supply devices which can be used in such a system. Sealing features may be present to seal liquid to the localized area. One way which has been proposed to arrange for this is disclosed in PCT patent application publication no. WO 99/49504.

In the all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 (which are described below) may be used in such a system. However, sealing features might not be present, might not be activated, might not be as efficient as normal or might otherwise be ineffective to seal liquid to only the localized area.

Figure 2:
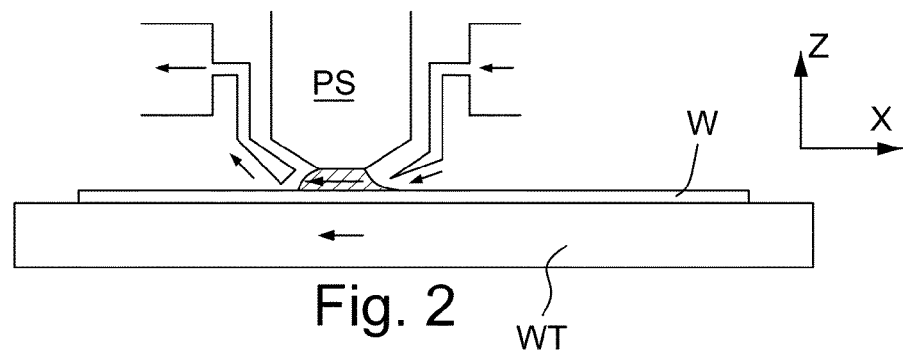
FIGS. 2 and 3 depict a liquid supply system for use in a lithographic projection apparatus.
Figure 3:
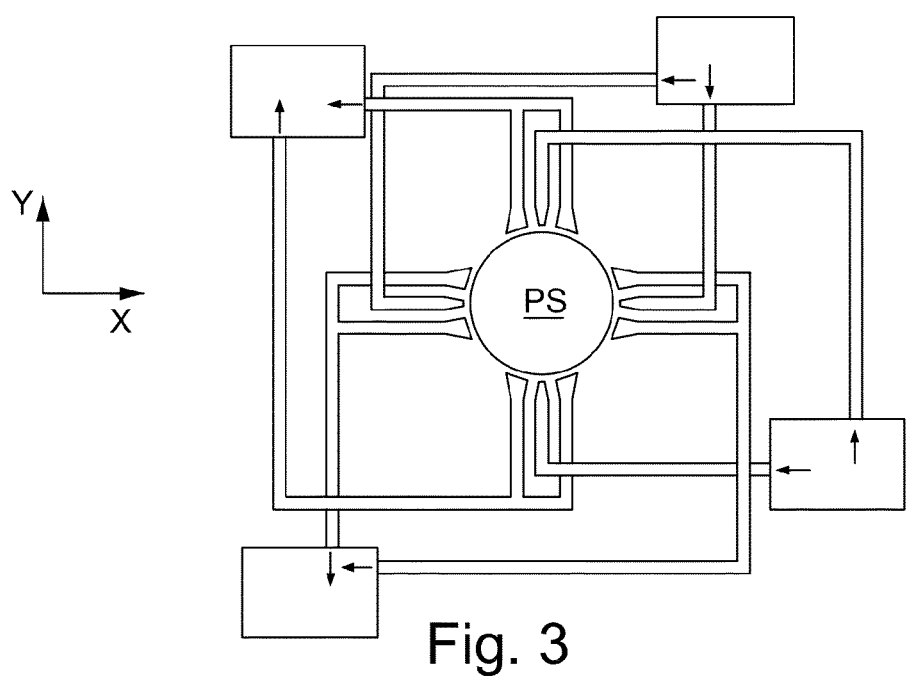

Four different types of localized liquid supply systems are illustrated in FIGS. 2-5. As illustrated in FIGS. 2 and 3, liquid is supplied by at least one inlet onto the substrate as indicated by an arrow, preferably along the direction of movement of the substrate relative to the final element. Liquid is removed by at least one outlet after having passed under the projection system as indicated by an arrow. As the substrate is scanned beneath the element in a −X direction, liquid is supplied at the +X side of the element and taken up at the −X side. FIG. 2 shows the arrangement schematically in which liquid flow is indicated by arrows; the liquid is supplied via inlet and is taken up on the other side of the element by outlet which is connected to a low pressure source. In the illustration of FIG. 2 the liquid is supplied along the direction of movement of the substrate relative to the final element, although this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
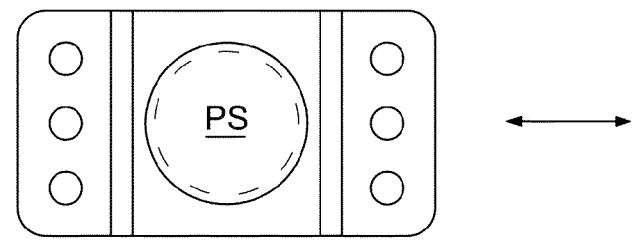
FIG. 4 depicts a further liquid supply system for use in a lithographic projection apparatus.
Figure 4:
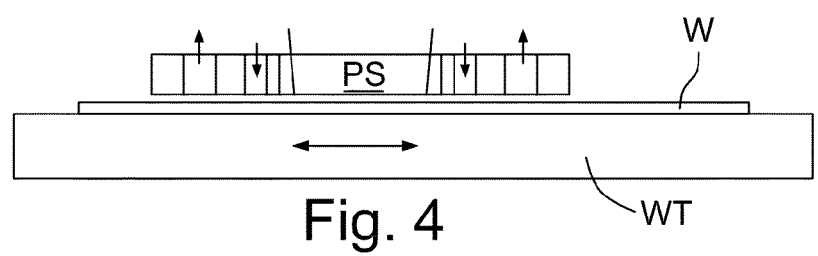

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate W is shown by arrows in FIG. 4.

Figure 5:
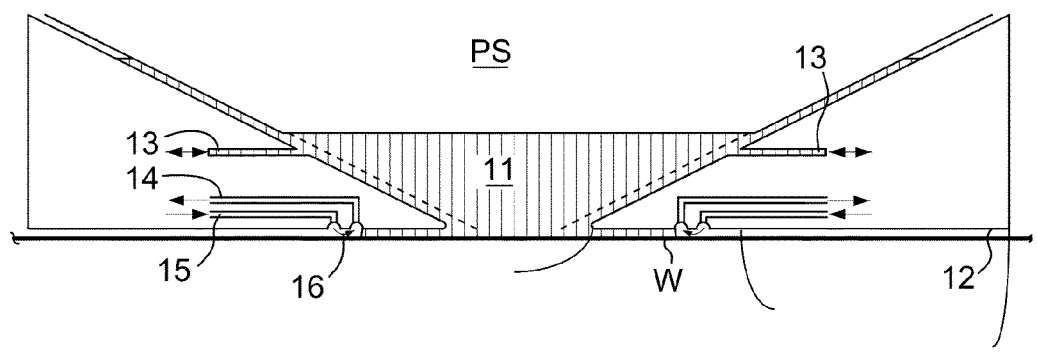
FIG. 5 depicts a further liquid supply system for use in a lithographic projection apparatus.

Another arrangement which has been proposed is to provide the liquid supply system with a liquid confinement structure which extends along at least a part of a boundary of the space between the final element of the projection system and the substrate table. Such an arrangement is illustrated in FIG. 5. Arrows indicate the direction of flow.

FIG. 5 schematically depicts a localized liquid supply system or fluid handling structure with a liquid confinement structure 12, which extends along at least a part of a boundary of the space 11 between the final element of the projection system PS and a facing surface (e.g. the substrate table WT or substrate W). (Please note that reference in the following text to surface of the substrate W also refers in addition, or in the alternative, to a surface of the substrate table WT, unless expressly stated otherwise. Reference to movement of the substrate relative to another object, for example a projection system, includes reference to movement of the substrate table relative to the same object, unless expressly stated otherwise.) The liquid confinement structure 12 is substantially stationary relative to the projection system PS in the XY plane though there may be some relative movement in the Z direction (in the direction of the optical axis). In an embodiment, a seal is formed between the liquid confinement structure 12 and the surface of the substrate W. The seal may be a contactless seal such as a gas seal (such a system with a gas seal is disclosed in United States patent application publication no. US 2004-0207824) or fluid seal.

The liquid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid confinement structure 12 positioned below and surrounding the final element of the projection system PS. Liquid is brought into the space 11 below the projection system PS and within the liquid confinement structure 12 by liquid inlet 13. The liquid may be removed by liquid outlet 13. The liquid confinement structure 12 may extend a little above the final element of the projection system PS. The liquid level rises above the final element so that a buffer of liquid is provided. In an embodiment, the liquid confinement structure 12 has an inner periphery that at the upper end closely conforms to the shape of the projection system PS or the final element thereof and may, e.g., be round or any other suitable shape. At the bottom, the inner periphery closely conforms to the shape of the image field, e.g., rectangular, though this need not be the case.

The liquid may be contained in the space 11 by a gas seal 16 which, during use, is formed between the bottom of the liquid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In another embodiment, the liquid confinement structure 12 does not have a gas seal.

Other types of liquid confinement structure to which an embodiment of the present invention may be applied include the so called gas drag liquid confinement structure such as that described in U.S. Patent Application No. 61/181,158 filed 25 May 2009, which is hereby incorporated by reference in its entirety. United States Patent Application Publication No. US 2008/0212046 provides further details and its content is also hereby incorporated by reference in its entirety.

The example of FIG. 5 is a so called localized area arrangement in which liquid is only provided to a localized area of the top surface of the substrate W at any one time. Other arrangements are possible for example, an arrangement using a single phase extractor on the undersurface of the liquid confinement structure 12 may be used. An extractor assembly comprising a single phase extractor with a porous member is described in United States Patent Application No. US 2006/0038968, incorporated herein in its entirety by reference. An arrangement in which such an extractor assembly is used in combination with a recess and a gas knife is disclosed in detail in United States Patent Application Publication No. US 2006/0158627 incorporated herein in its entirety by reference. An embodiment of the invention may be applied to a fluid handling structure used in all wet immersion apparatus. In the all wet embodiment, fluid is allowed to cover the whole of the top surface of the substrate table, for example, by allowing liquid to leak out of a confinement structure which confines liquid to between the final element of projection system and the substrate. An example of a fluid handling structure for an all wet embodiment can be found in U.S. Patent Application No. 61/136,380 filed on 2 Sep. 2008.

In an immersion lithographic apparatus liquid is provided to the substrate W. Liquid itself can provide a thermal load to the substrate W or a thermal load can be imparted to the substrate W as liquid on the substrate W evaporates. Another source of a thermal load may be a gas flow over the substrate W. If a thermal load is imparted to a local area of the substrate W, this can lead to a thermal variation in the surface of the substrate W to be imaged and thereby possibly an overlay error. If the temperature of the substrate, particularly in plan, is not uniform this may be deleterious. Particularly for localized area liquid supply systems (such as those illustrated in FIGS. 2-5) a non-uniform thermal load as described above may be a high risk.

In an embodiment of the present invention a heat pipe 100 is used in order to provide a localized heat load to an area of the substrate (in plan) which has reduced in temperature compared to the surrounding area (e.g. due to receiving a cooling load, for example due to the presence of liquid or the evaporation of liquid on the substrate W or a gas flow over the substrate W).

Figure 6:
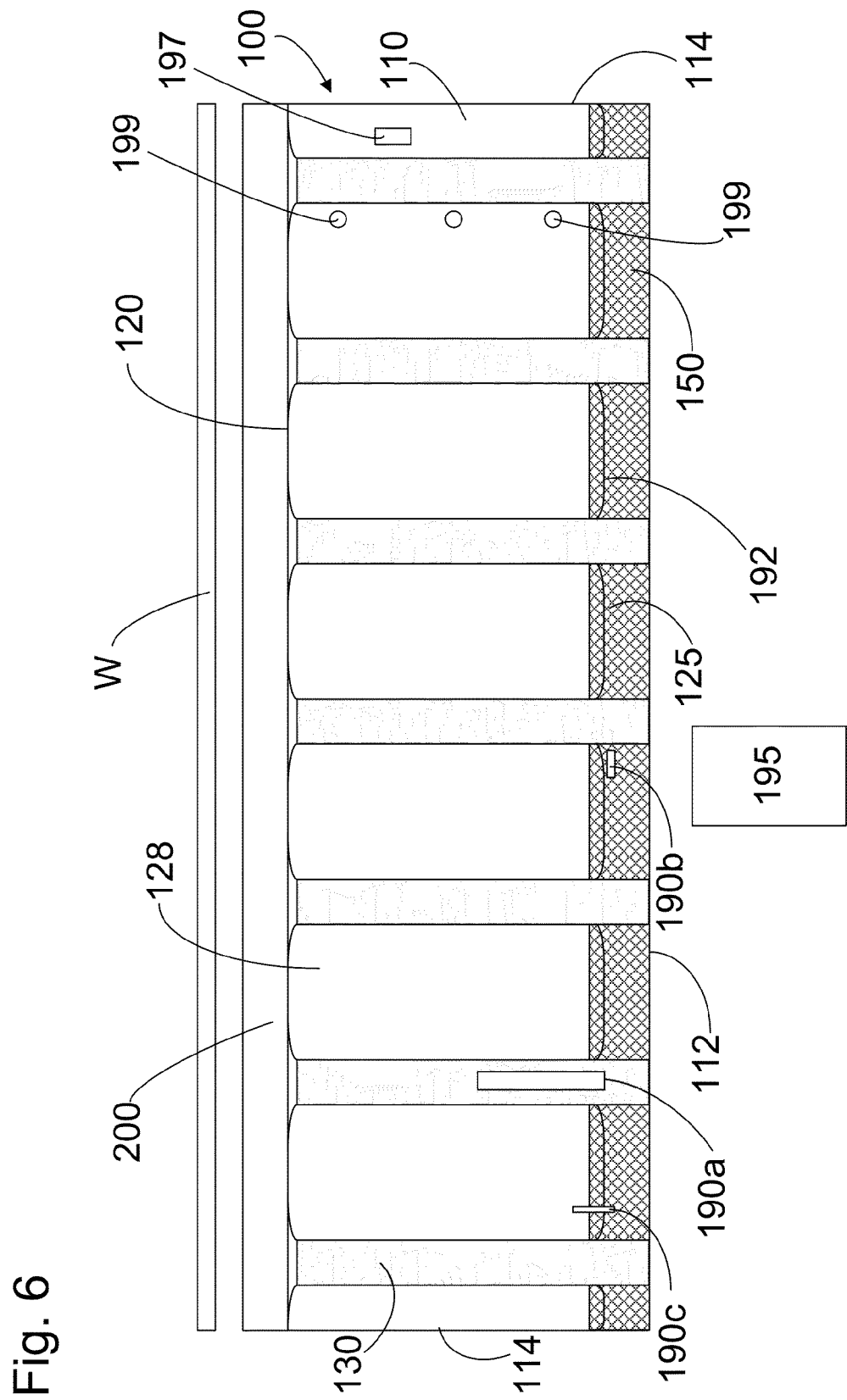
FIG. 6 depicts, in cross-section, a heat pipe, substrate holder and substrate according to an embodiment.

One embodiment is illustrated in FIG. 6. FIG. 6 illustrates, in cross-section, a heat pipe 100 which is provided in the substrate table WT. The heat pipe 100 is positioned below a substrate holder 200 which holds the substrate W. The substrate holder 200 may be a so called burl plate or pimple table or alternatively may be an electrostatic chuck or a different type of substrate holder 200. The type of substrate holder 200 is not limited.

In a burl plate or pimple table, a top surface of the substrate holder 200 is provided with a plurality of projections. The substrate W rests on those projections. An underpressure is applied in the gaps between the projections thereby to suck the substrate W onto the projections. In this way the substrate W is held by the substrate holder 200.

Although the heat pipe 100 is illustrated as only being underneath the substrate holder 200, the heat pipe 100 may be larger and may also be under other features of the substrate table WT radially outwardly (with respect to the optical axis of the projection system PS) of the substrate holder 200. For example, the heat pipe 100 may be under a gap between the substrate W and an edge of a recess in the substrate table WT in which the substrate W lies and/or an extraction system configured to remove gas and/or liquid from that gap. The heat pipe 100 may, for example, extend under one or more sensors and/or one or more markers (e.g., alignment markers).

The heat pipe 100 is comprised of a chamber 110. The chamber 110 is defined by walls including side wall(s) 114, a bottom wall 112 and a condensing surface 120. The condensing surface 120 is opposite the bottom wall 112. The condensing surface 120 is the top surface which forms a ceiling to the chamber 110. The condensing surface 120 is adjacent the substrate holder 200. In one embodiment the condensing surface 120 is formed by the substrate holder 200.

The chamber 110 is filled with a liquid in a reservoir 125 and vapor of the liquid in the reservoir 125 in a vapor space 128 above the reservoir 125. The chamber 110 is a closed system and desirably contains no gas or liquid other than the liquid in the reservoir 125 and the vapor of that liquid in the vapor space 128. The vapor in the vapor space 128 is saturated.

If a local area of the condensing surface 120 is at a lower temperature than another area of the condensing surface 120, vapor in the vapor space 128 will condense on the condensing surface 120 at the locally cool area. During the phase transformation from vapor to liquid (condensation), latent heat of evaporation is expelled to the condensing surface 120. Thereby energy is provided to the cold area, heating it up. This will continue until the area reaches the substantially same temperature as the vapor. In this way the area which has received a cooling heat load is provided with energy thereby to increase that area's temperature to the substantially same temperature as the surrounding area. No overshoot can occur.

In this way the temperature of the substrate W is maintained substantially uniform (in plan) because the energy from the condensation phase transformation is conducted through the substrate holder 200 to the substrate W.

After condensation on the condensing surface 120 liquid returns to the reservoir 125 (as described in detail below). One or more heating elements 190a, 190b, and/or 190c are provided in the chamber 110 to heat liquid in the reservoir 125. In this way the energy lost during the condensation reaction is replaced and the temperature of the liquid in the reservoir 125 and of the vapor in the vapor space 128 and therefore the condensing surface 120 are all maintained at the substantially same constant temperature.

The liquid is likely to have a lower thermal conductivity than the material defining the condensing surface 120 and the material of the substrate holder 200 (e.g., about three orders of magnitude less). Therefore, in order to ensure fast thermal response of the heat pipe and to reduce or minimize the temperature difference across the condensate layer, it is desirable that any film of liquid on the condensing surface 120 is as thin as possible. This is because during condensation the energy provided by the condensation reaction needs to be conducted through any liquid on the condensing surface before it reaches the condensing surface 120. Therefore, it is desirable to take measures to reduce the thickness of any film on the condensing surface 120 as far as is possible.

It is advantageous that the condensing surface 120 is non-porous. This is because a porous surface would trap liquid thereby increasing the thickness of the liquid through which any heat of condensation would need to pass before reaching the substrate W. Therefore, providing a porous condensing surface 120 would reduce the reaction time of the heat pipe 100 to a cooling load on the substrate W.

In the embodiment of FIG. 6 two measures are taken to aid the transfer of liquid from the condensing surface 120 to the reservoir 125. Together the two measures may also or alternatively reduce the chance of dripping of liquid from the condensing surface 120 into the reservoir 125. Such dripping is deleterious, first because it may induce unwanted vibrations in the substrate table WT and second because it may induce unwanted thermal shock in the heat pipe 100. The heat pipe 100 may not be able to cope with such a thermal shock leading to a thermal variation in the condensing surface.

As a first measure, the heat pipe 100 is provided with a liquid transporter 130 (shown shaded throughout the Figures). The liquid transporter 130 is arranged to apply a force (additional to gravity) to liquid in the direction of the reservoir 125. That is, the liquid transporter 130 is arranged to transport liquid away from the condensing surface 120 towards the reservoir 125. In an embodiment the liquid transporter 130 has an end in the reservoir 125. In this way liquid from the condensing surface 120, once it has entered the liquid transporter 130 will be transported all the way to the reservoir 125.

As a second measure, the condensing surface 120 is shaped such that condensed liquid moves along it (i.e. in a direction with a component in the plane of the surface of the condensing surface 120) towards the liquid transporter 130.

Together or separately the liquid transporter 130 and the shape of the condensing surface 120 act efficiently to transport liquid from the condensing surface 120 back to the reservoir 125. This keeps the thickness of a film of liquid on the condensing surface 120 as low as possible thereby improving the thermal response of the heat pipe 100 to a cooling load on the substrate W and reducing or minimizing the temperature difference across the film of liquid. This is because the thickness of liquid through which heat of condensation is conducted before it can reach the substrate W is reduced.

Desirably the liquid transporter 130 is a passive liquid transporter 130. In one embodiment the liquid transporter 130 applies force to the liquid by capillary action. Desirably the liquid transporter 130 is comprised of a porous material. In this way condensed liquid can be wicked away from the condensing surface 120 and into the reservoir 125. In an alternative embodiment illustrated in FIGS. 15 and 16 and described below, the liquid transporter 130 can comprise at least one capillary groove. The capillary force in the liquid transporter 130 is higher than gravity.

Making the liquid transporter of a porous material is advantageous because it increases the surface area of the liquid. This results in faster evaporation and/or faster achievement of thermal equilibrium in the liquid. This results in a faster thermal response of the heat pipe to a cooling load on the substrate W. Furthermore, a porous material will reduce adverse liquid sloshing.

An addition or alternative to a liquid transporter which applies the force to the liquid by capillary action would be a combination of a conduit and a pump which could be used to pump liquid from the condensing surface 120 (for example from an area of the condensing surface 120 to which liquid is directed by virtue of the shape of the condensing surface 120) to the reservoir 125. An alternative or additional pumping method is, for example, electrostatic pumping of the liquid by at least two electrodes. The electrodes can be manufactured by a thin film technique.

The shape of the condensing surface 120 is such that condensed liquid moves along it towards the liquid transporter 130. In one embodiment the condensing surface 120 is shaped such that the condensed liquid moves along it towards the liquid transporter 130 under gravity. For example, the condensing surface 120 may be profiled so that the surface is angled from the horizontal towards the liquid transporter 130. In this way liquid would drain along the surface under the force of gravity towards the liquid transporter 130. Movement of the liquid along the condensing surface 120 may be towards the liquid transporter 130. This may avoid sudden instantaneous thermal movement instability (i.e. dripping from the condensing surface 120 to the reservoir 125) or dripping due to acceleration of the substrate table WT.

The liquid transporter 130 is aligned with features on the condensing surface 120 so that liquid is directed by the features of the condensing surface 120 onto the liquid transporter 130.

Alternatively or additionally the condensing surface 120 could be arranged to be maintained substantially dry so that drop wise condensation is promoted. One way of arranging this is to make the condensing surface 120 lyophobic such that liquid from the reservoir 125 makes a static contact angle with the condensing surface 120 of greater than 90°, desirably greater than 100°, more desirably greater than 110°, 120°, 130°, 140° or even 150°. In one embodiment the contact angle which liquid from the reservoir 125 makes with the condensing surface 120 is greater than 160° or 170°. This reduces the biggest resistance to condensation (the presence of a liquid film) over a large portion of the area of the condensing surface 120. This is at the expense of increasing the resistance to condensation (by insulation) over areas of the condensing surface 120 where droplets have formed.

Acceleration forces acting on the heat pipe 100 (for instance acceleration forces of a substrate table WT) act on droplets on the condensing surface 120 such that they move on the condensing surface 120. Desirably the droplets move off the condensing surface 120. The droplets may move off the condensing surface 120 by moving towards the liquid transporter 130. At the liquid transporter the droplets are then removed as described elsewhere. Alternatively or additionally droplets drop off the condensing surface 120 directly into the reservoir 125. This embodiment is a trade off between high condensation resistance at certain points of the condensing surface 120 and low condensation resistance at other points of the condensing surface 120. Additionally, as described above, dripping liquid from the condensing surface 120 into the reservoir 125 may be deleterious because of unwanted vibrations. Thus, the embodiment where accelerations of the heat pipe 100 result in droplets of liquid being moved towards the liquid transport 130 and being transported by the liquid transporter 130 back to the reservoir 125 are desirable.

The condensing surface 120 may be provided with a coating such that it exhibits the lyophobic nature to the liquid in the reservoir 125 described above. Additionally or alternatively, the condensing surface 120 could have a surface treatment applied to it thereby to achieve the required lyophobic nature. The contact angle which the liquid from the reservoir makes with the condensing surface may vary over the condensing surface.

The droplet embodiment described above provides a higher heat transfer coefficient than the film embodiment described below. Also, in this embodiment the acceleration forces of the heat pipe 100 are more able to help in movement of the condensate. This is because of their form in droplets and because of their high contact angle with the condensing surface 120.

The condensing surface 120 may be shaped to direct the droplets towards the liquid transporter 130. The condensing surface 120 may have any shape. One example of the shape of the condensing surface may be a parabola. The accelerations of the substrate table WT perturb the droplets on the condensing surface 120 to move, for example to move towards the liquid transporter 130.

Additionally or alternatively the condensing surface 120 may be shaped such that the condensed liquid moves along it towards the liquid transporter 130 under a surface-tension drainage force.

In one embodiment the curve of the condensing surface 120 is such that a surface-tension drainage force acts on a film of liquid on the condensing surface 120. The surface-tension drainage force can act in any direction, not just in the direction that gravity acts (e.g. in a direction against gravity). The curve of the condensing surface 120 is selected so that the surface-tension drainage force acts in a particular direction (e.g. a first direction). The direction is chosen such that the surface-tension drainage force acts on the liquid in a desired direction. The direction may have a vertical and/or horizontal component. The curved condensing surface 120 can be used to generate a surface-tension drainage force to help drain the condensing surface 120 of liquid towards the liquid transporter 130. The term surface-tension drainage force is the term used in the art, but as used herein the force does not necessarily act to "drain" liquid, as described above.

Surface-tension drainage force has been investigated in connection with condensing fins of condensers in which the surface-tension drainage force is used to move liquid from the tips of fins in a direction perpendicular to the force of gravity into the valley between fins. Once the liquid reaches the valley between fins gravity then acts on the liquid to remove it downwards. In this way a thin film of liquid which has condensed on the tips of fins can be moved off the tips of fins so that further liquid may condense on the films. See, e.g., the book "Heat Transfer Handbook" by Adrian Bejan and Allan D. Kraus published by John Wiley & Sons, 11 Jul. 2003.

Chapter 10 of the "Heat Transfer Handbook" describes surface-tension drainage force. In summary, if a liquid-vapor interface is curved, a pressure difference across the interface must be present to establish mechanical equilibrium of the interface. A large difference in pressure between the liquid and vapor occurs if the liquid has a large surface tension and the surface a small radius of curvature. A basic curved shape which can induce surface-tension drainage force is a curve whose local radius of curvature decreases in a first direction e.g. decreases in a direction towards the liquid transporter 130. This would result in a surface-tension drainage force acting on a film of liquid on the surface in the first direction.

Adamek defined (in Adamek, T., 1981, "Bestimmung der Kondensationgroessen auf feingewellten Oberflaechen zur Auslegung optimaler Wandprofile," Waerme-und Stoffuebertragung, Vol. 15, pp 255-270) a series of curves in which the surface-tension drainage force is particularly high. The equation of the curves is $$\kappa = \frac{\theta_m}{S_m}\left(\frac{\xi+1}{\xi}\right)\left[1 - \left(\frac{s}{S_m}\right)^\xi\right] \text{ for } -1 \le \xi \le \infty$$

in which $\kappa$ is the curvature of the liquid-vapor interface, $\theta_m$ is the maximum angle through which the condensate surface turns, $S_m$ is the maximum arc length, $\xi$ is a shape factor and s is the distance along the liquid-vapor interface.

For the simple case that there is only liquid film drainage without condensation onto this liquid film, the liquid film flow through each cross-section is constant. To maximize draining, the liquid film thickness is constant at each cross-section, which implies that the pressure gradient is constant. As the pressure gradient is linear with the gradient of the liquid film curvature and the liquid film thickness is constant, the wall profile in one embodiment may have a linearly decreasing curvature from start to end. Whenever there is condensation onto the liquid film while draining, the flow increases from start to end, which requires a slightly different wall profile for optimal drainage. Then a detailed calculation may be performed to exactly determine the wall profile. The pressure gradient has to increase towards the end to compensate for the higher flow.

Curves on the condensing surface 120 with an Adamek profile are desirable because they are particularly efficient at applying a large surface-tension drainage force thereby maximizing liquid drainage and minimizing liquid film layer thickness. The so called Adamek profiles are optimized for drainage, meaning for minimum thickness.

Desirably the surface of the condensing surface is such that the film of liquid on the surface is less than or equal to 20 µm, desirably less than or equal to 10 µm, or desirably less than or equal to 1 µm.

Alternatively to or in addition to the condensing surface 120 being shaped such that condensed liquid moves along it towards the liquid transporter 130 under gravity and/or under a surface-tension drainage force, the condensing surface 120 may be shaped such that acceleration of the object applies a force to liquid on the condensing surface 120 to return the liquid to the liquid reservoir 125. That is, during operation of a lithographic apparatus, high acceleration is present, particularly so for the substrate table WT. This acceleration is mainly in the horizontal direction. It is possible to shape the condensing surface 120 such that the high acceleration applies a force to liquid on the condensing surface 120 to return the liquid to the reservoir 125. In this embodiment the liquid may be returned to the reservoir via a liquid transporter 130 just as in the other embodiments described.

In the embodiments where surface-tension drainage forces are used to move the condensed liquid towards the liquid transporter 130, the condensing surface 120 may advantageously be lyophilic. That is, the liquid in the reservoir 125 makes a contact angle with the condensing surface 120 of less than 90°, for instance less than 80°, 70°, 60°, 50°, 40° or 30°. In an embodiment the liquid in the reservoir 125 may make a contact angle of less than 20° or even less than 10° with the condensing surface 120. The lyophilic nature of the condensing surface 120 helps in the creation of a film on the surface such that the surface-tension drainage effect is achieved. For this purpose, the condensing surface 120 may be provided with a surface treatment or a coating.

In an embodiment a porous member 150 (shown double cross-hatched) is provided at the bottom of the heat pipe 100 desirably substantially covering the bottom wall 112 of the chamber 110. In one embodiment the reservoir 125 is entirely within the porous member 150, as illustrated. In this way liquid in the reservoir 125 will be held within the porous member 150 and this can help in preventing sloshing of the liquid in the reservoir 125 during acceleration (negative or positive) of the substrate table WT. This is advantageous because otherwise the sloshing can cause an undesirable force to be generated in the substrate table WT.

In one embodiment the liquid transporter 130 is not present and liquid moves from the condensing surface 120 directly to the porous member 150. That is, the porous member 150 can be seen as a liquid transporter to apply a force additional to gravity to liquid thereby to transport liquid away from the condensing surface 120 towards the reservoir (i.e. by capillary action). Thus, the projections 220 described below with reference to FIGS. 8-12 would extend down towards the porous member 150 which would act as a liquid transporter. That is, the liquid transporter has the form of a porous member 150 extending continuously along the bottom of the chamber 110 with a planar top surface.

In the embodiment of FIG. 6 the liquid transporter 130 is comprised of a plurality of porous members extending between the bottom wall 112 and the condensing surface 120. In this way the liquid transporter 130 may help in preventing the substrate holder 200 from sagging between the side wall(s) 114. In this embodiment the liquid transporter 130 is desirably comprised of a material which has a coefficient of thermal expansion substantially the same as the material from which the walls of the chamber 110 are made. If the coefficient of thermal expansion is much different, this could undesirably lead to bowing of the substrate holder 200. Any such bow would be transferred to the substrate W and thereby may lead to imaging error.

Figure 7:
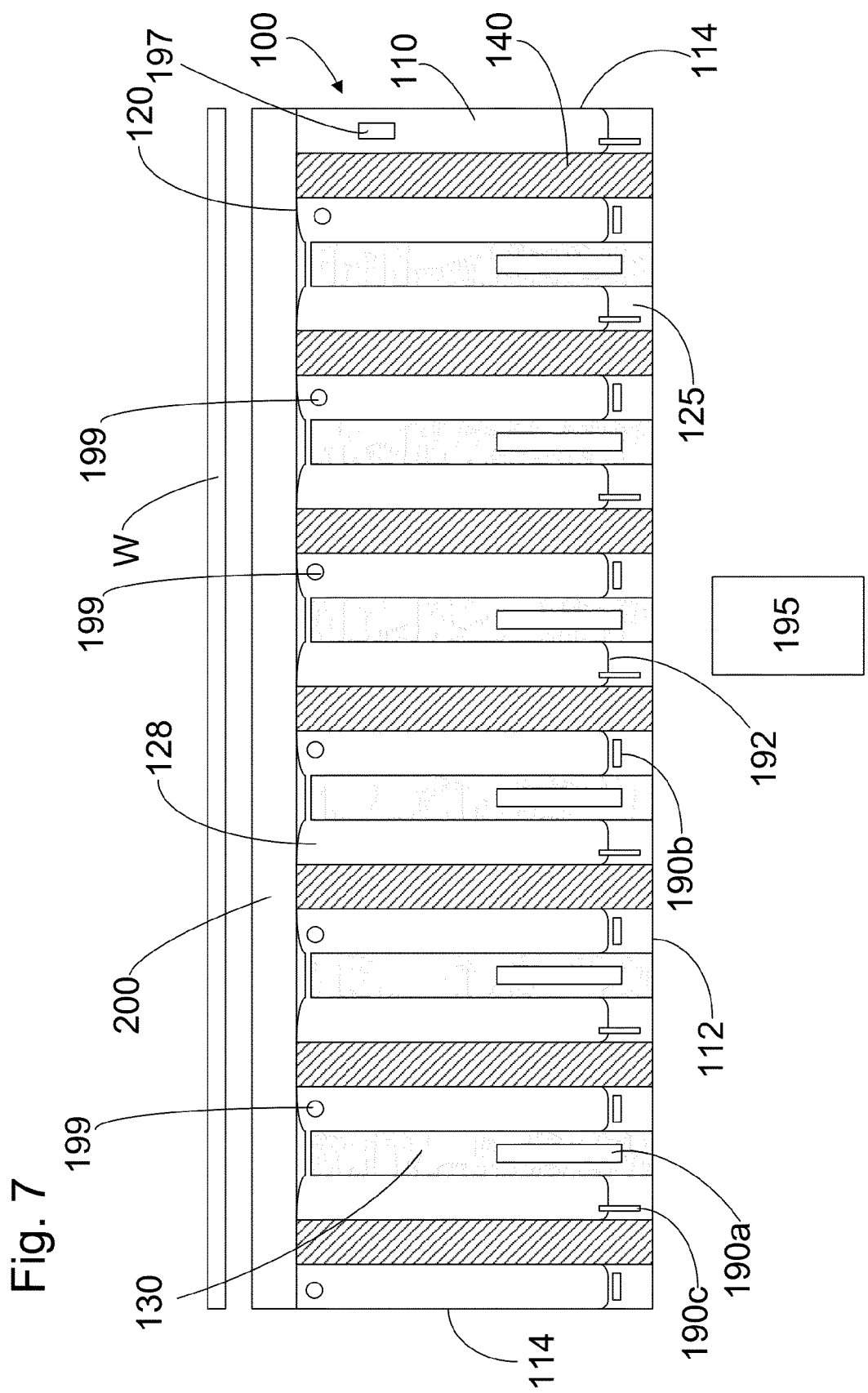
FIG. 7 depicts, in cross-section, a heat pipe, substrate holder and substrate according to an embodiment.

It may not be possible to match the coefficient of thermal expansion of the liquid transporter 130 to that of the material defining the walls of the chamber 110. In that case a gap between the liquid transporter 130 and the condensing surface 120 (as illustrated in FIG. 7) or between the liquid transporter 130 and the bottom wall 112 could be provided. Alternatively or additionally, a split in the liquid transporter 130 could be provided (e.g. a gap in the liquid transporter 130) at a location spaced from the bottom wall 112 and the condensing surface 120. Alternatively or additionally, the material of the liquid transporter 130 or its design could be made such that it is compliant/flexible (e.g. a mesh) and thereby does not induce a force on the substrate holder 200 significant enough to bend the substrate holder 200 when thermal expansion or thermal contraction happens.

It may be necessary to provide one or more structural members 140 (shown hatched in, for example, FIGS. 7 and 13-15) extending between the bottom wall 112 and the condensing surface 120 in the chamber 110. Such structural member 140 supports the substrate holder 200 thereby helping to ensure that the substrate holder 200 does not deform under its own weight (or any other force applied to it). Desirably the structural member 140 has a coefficient of thermal expansion which is substantially the same as that of the material of the walls from which the chamber 110 is defined. In one embodiment, the structural member 140 is made from the same material as the body of the substrate table WT which defines the walls of the chamber 110. The structural member 140 helps ensure the stiffness (integrity, robustness, stability) of the heat pipe 100.

FIG. 7 illustrates an embodiment in which a gap exists between the liquid transporter 130 and the condensing surface 120 and one or more structural members 140 are also provided. Various different embodiments of condensing surface 120 will be described with reference to FIGS. 8-12 and various arrangements of liquid transporter 130 and structural member 140 will be described with reference to FIGS. 13-16 below. In the embodiment of FIG. 7, a porous member 150 may not be necessary if the liquid transporter 130 and structural member 140 are close enough together (say less than 0.1 mm apart). Small projections between the liquid transporter 130 and structural member 140 could serve the same function.

Desirably the liquid transporter 130 has a high thermal conductivity. This may be advantageous because a high thermal conductivity will make achievement of thermal equilibrium within the chamber 110 more likely. Desirably the material of the liquid transporter 130 (and of the structural member 140, if present) has thermal conductivity of at least 10 W/m/K or at least 100 W/m/K, desirably at least 150 W/m/K. A suitable material is SiSiC which has a thermal conductivity of 185 W/m/K. In an embodiment, where a heater is present or connected to or in the liquid transporter 130, it may be undesirable that the liquid transporter 130 has a high thermal conductivity. This is because the liquid transporter 130 could conduct heat up to the condensing surface 120. Therefore, in this embodiment it may be desirable that the liquid transporter has a low thermal conductivity.

In an embodiment in which the liquid transporter 130 is made of a porous material, the pore size may vary from the top of the liquid transporter 130 (the end near the condensing surface 120) to the bottom of the liquid transporter 130 (the end near the liquid reservoir 125). The pore size is lowered in the direction from top to bottom thereby to enhance drainage. In an embodiment the liquid transporter 130 may be attached to the condensing surface 120 and is flexible enough such that acceleration of the heat pipe 100 (for example during substrate table WT movement) bends the liquid transporter. This will drive liquid downwards due to an acceleration force. In this embodiment the liquid transporter 130 may be made of a porous or a non-porous material (for example in the case of a non-porous material the liquid transporter may be in the form described below with reference to FIGS. 16 and 17). In this embodiment there is enhanced evaporation from the liquid transporter 130. In this embodiment the liquid transporter 130 may be sized such that when it is not bent by an acceleration force, it forms a liquid bridge to the porous member 150.

Condensing of vapor from the vapor space 128 onto the condensing surface 120 results in an overall loss of energy from the sealed chamber 110. In order to replace this energy and thereby maintain thermal equilibrium, one or more heating elements 190a, 190b, and/or 190c are provided. In order to help ensure a fast response of the heat pipe 100, the heating element 190a, 190b, 190c is provided in contact with liquid in the chamber 110. Desirably the heating element 190a, 190b, 190c is provided as close as possible to the liquid/vapor interface. This reduces or minimizes the distance through which heat from the heating element 190a, 190b, 190c needs to be conducted before it reaches the liquid/vapor interface at which evaporation of liquid to vapor (to replace the vapor which has condensed) will occur. The further from the liquid/vapor interface the heating element 190a, 190b, 190c is, the longer the reaction time of the heat pipe 100.

FIG. 6 illustrates possible locations of the heating element 190a, 190b, 190c. The heat pipe 100 may be provided with heating elements at all locations, at two locations or only at one location. Only a single heating element may be provided or a plurality of heater elements 190a, 190b, 190c may be provided.

The heating element 190a, 190b, 190c is at least partly in contact with liquid in the chamber. A first location for the heating element is illustrated at 190a and is in a liquid transporter 130. Desirably the heating element 190a is positioned in the liquid transporter 130 where it will always be in contact with (desirably completely surrounded by) liquid in the liquid transporter 130.

A second location of heating element is illustrated at 190b and is fully within the reservoir 125. Desirably the heating element 190b is provided close to the interface 192 between the liquid in the reservoir 125 and the vapor in the vapor space 128. The level of liquid in the chamber 110 can vary. Therefore, the heating element 190b may only be partly submerged by liquid and therefore only partly within the reservoir 125.

Another location of heating element is illustrated at 190c. The heating element 190c is elongate. The elongate direction of the heating element 190*c* is substantially perpendicular to the surface of liquid in the reservoir 125. Therefore, use of a heating element of the type 190*c* under conditions where the level of liquid in the reservoir 125 varies considerably has an advantage that at least part of the heating element 190*c* will always be in contact with liquid in the chamber 110.

A heating element at location 190*b* and/or 190*c* could be completely or partially within the porous member 150.

Desirably the heat pipe 100 contains as little liquid as possible (e.g. at least less than an amount which would saturate the porous structures). This reduces the weight of the apparatus and reduces the chance of sloshing of liquid taking place. However, it is undesirable that the heat pipe 100 runs out of liquid as the heating element 190*a*, 190*b*, 190*c* may then dry out.

If the heating element 190*a*, 190*b*, 190*c* is only partly submerged, it is desired that a larger portion of the heating element is submerged than is not submerged. During operation, vapor generated by the heater 190*a*, 190*b*, 190*c* goes to where the pressure in the vapor space 128 is lowest, which is underneath the coldest part of the condensing surface 120.

There are two main ways of controlling the power applied to the heating element 190*a*, 190*b*, 190*c*. The amount of power is controlled by controller 195. The controller 195 receives signals from either or both of a pressure sensor 197 and one or more temperature sensors 199. As described below, measures are taken to help ensure flow of vapor in the vapor space 128 to cold spots on the condensing surface 120 by providing a path for the vapor to flow to the area of lowest pressure thereby to equalize pressure and achieve equilibrium. Therefore, the pressure of vapor in the vapor space 128 should be substantially constant throughout the vapor space 128. Therefore, only one pressure sensor 197 need be provided. As vapor condenses on the condensing surface 120, pressure of vapor in the vapor space 128 will drop. This can be detected by the pressure sensor 197 and this information is provided to the controller 195. In response, the controller 195 can control a heating element 190*a*, 190*b*, 190*c* to account for the condensation of some vapor from the vapor space 128 and replace that vapor by further evaporation of liquid.

An advantage of using a pressure sensor 197 is that pressure of vapor is averaged over the whole volume of the vapor space 128 so that the location of the pressure sensor 197 should not affect its reading. However, a disadvantage is that scanning motion of the substrate table WT (e.g. a large acceleration) can interfere with the pressure reading. Therefore, it may be desirable alternatively or additionally to use a signal from one or more temperature sensors 199 in the controller 195.

As vapor from the vapor space 128 condenses on the condensing surface 120 the temperature in the chamber 110 will decrease. The temperature sensor 199 can provide this information to the controller 195 which can control the heating element 190*a*, 190*b*, 190*c* to apply energy to the chamber 110. A disadvantage of a temperature sensor is that it can be slow to react to a change in temperature (because of its inherent heat capacity and the surrounding material) and the information it provides is only regarding it local surroundings. The latter disadvantage can be managed to some extent by providing a plurality of temperature sensors 199 spatially distributed in the chamber 110. As illustrated in FIG. 6 these could be provided different distances from the reservoir 125 in the vapor space 128 and additionally or alternatively in the liquid in the reservoir 125. Alternatively or additionally, as illustrated in FIG. 7, temperature sensors 199 may be distributed horizontally within the vapor space 128. In an embodiment, the temperature sensor is provided in a structural member 140, or a liquid transporter 130 or a porous member 150 or the reservoir 125. In an embodiment the temperature sensor covers a large area (e.g. is in the form of a spirally wound platinum wire or vapor deposited layer on the under surface of the substrate holder 200).

Figure 8:
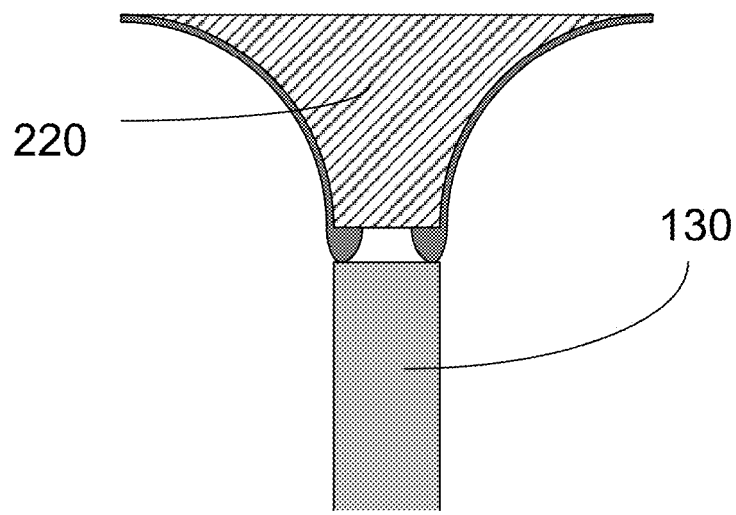
FIG. 8 depicts, in cross-section, an embodiment of a detail of the heat pipe of FIG. 7.

As described above, in the embodiment of FIG. 7, a gap exists between the bottom of the condensing surface 120 and the liquid transporter 130. A detail of this gap is illustrated in FIG. 8.

Figure 9:
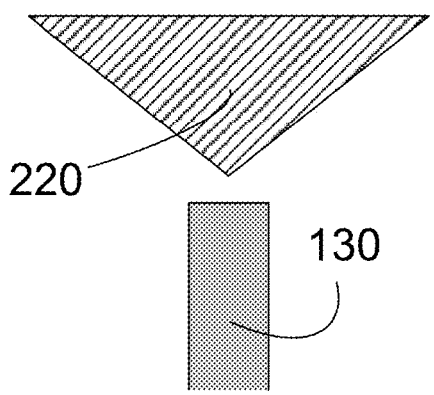
FIG. 9 depicts, in cross-section, an embodiment of a detail of the heat pipe of FIG. 7.
Figure 10:
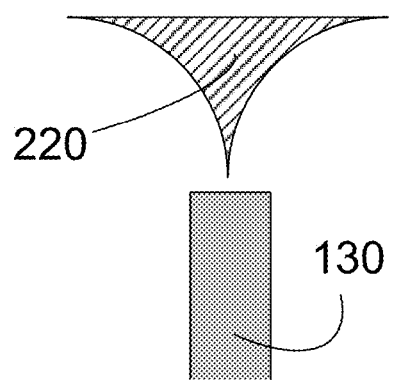
FIG. 10 depicts, in cross-section, an embodiment of a detail of the heat pipe of FIG. 7.
Figure 11:
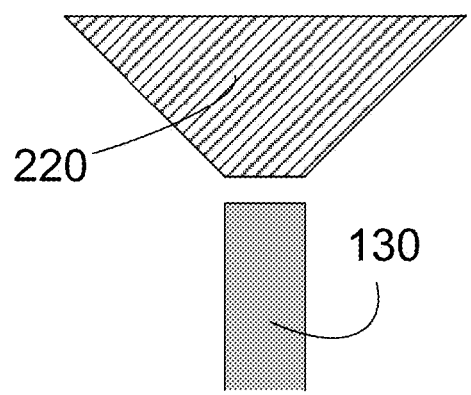
FIG. 11 depicts, in cross-section, an embodiment of a detail of the heat pipe of FIG. 7.

As can be seen, the condensing surface has a projection 220 on it. The projection projects down towards the top of the liquid transporter 130. In an embodiment the condensing surface 120 is curved such that its surface changes its angle to horizontal smoothly from being horizontal at a position between adjacent parts of the liquid transporter (or adjacent liquid transporters) to being at an angle to horizontal closer to the liquid transporter. FIGS. 9, 10 and 11 show different cross-sectional profiles of projections 220 on the condensing surface 120 including embodiments with flat surfaces. Each of the other shapes are possible embodiments. The projections 220 are compatible both with the embodiments of FIGS. 6 and 7 (e.g. where a gap exists between the top of the liquid transporter 130 and where there is no such gap). Advantageously the condensing surface is smooth (e.g. does not have any corners). Liquid can be trapped at a corner and this increases the thermal resistance between the vapor in the vapor space 128 and the substrate W. That is, more energy will be needed to vary the temperature of the vapor for a given temperature difference of the substrate.

In an embodiment the surface of the projection 220 is shaped that such that the condensed liquid moves along it towards the liquid transporter 130 under a surface-tension drainage force generated by the shape of the projection as described above in connection with the condensing surface 120.

In the instance where a gap exists between the top of the liquid transporter 130 and the projection 220, the gap is desirably of a size less than the droplet size at which a droplet of liquid in the chamber would fall from the condensing surface under the force of gravity. At a given temperature and pressure, liquid has a critical size of droplet at which its surface tension can no longer support its weight and that at which point it will drop. If the gap between the projection 220 on the condensing surface 130 and the top of the liquid transporter 130 is smaller than that critical droplet size, a droplet will not drop off the condensing surface but will be drained away by the liquid transporter 130 prior to reaching the critical size. In practice this means that the gap between the condensing surface and the liquid transporter should be less than or equal to 1 mm, desirably less than or equal to 0.5 mm, more desirably less than or equal to 0.2 mm, or desirably less than or equal to 100 μm. In one embodiment the gap is at least 1 μm. The distance between the projection 220 and liquid transporter 130 should be such that the capillary force in that distance is smaller than the capillary force of the liquid transporter 130. Alternatively put the gap should be smaller than the local radius at the end of the condensing surface 120 above the liquid transporter 130. In one embodiment the capillary pressure reduces from a position on the condensing surface 120 to the porous member 150. For the condensing surface 120, a radius of less than or equal to 1 mm should be present at the end by the liquid transporter 130. Desirably that radius is less than or equal to 0.1 mm or more desirably less than or equal to 0.01 mm. Thus, the gap should be smaller than that local radius. In one embodiment, the liquid transporter 130 has a pore radius (when it is porous) or a groove radius (when it is grooved as in the embodiment of FIGS. 16 and 17) smaller than the condensation/vapor interface radius (reciprocal of its curvature).

It is desirable that the gap between the condensing surface and the liquid transporter 130 is of a size such that the capillary force on liquid in the gap creates a lower pressure in the liquid than the lowest pressure of liquid on the condensing surface 120. This helps ensure that liquid is drawn into the gap from the edge of the side wall of the projection 220 and is not allowed to build up at the bottom of the side wall of the projection 220 thereby reducing the efficiency of removal of liquid from the condensing surface.

In the embodiment of FIG. 9, the condensing surface 120 is comprised of a plurality of flat surfaces. The surfaces are angled such that liquid under the force of gravity will move towards a liquid transporter 130.

Figure 12:
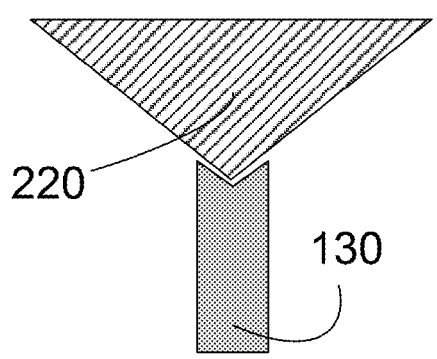
FIG. 12 depicts, in cross-section, an embodiment of a detail of the heat pipe of FIG. 7.

The embodiment of FIG. 10 is the same as the embodiment of FIG. 8 except that the projection 220 does not have a flat bottom and instead ends in a point. Similarly, the embodiment of FIG. 11 is similar to that of FIG. 9 except that rather than ending in a point the projection ends in a flat bottom 220 (e.g. is a trapezium, in cross-section). FIG. 12 is the same as that of FIG. 9 except that a recess is provided in the top of the liquid transporter 130 in which the projection 220 may project. This is advantageous in the situation where a small vertical tolerance is difficult to manufacture.

Figure 13:
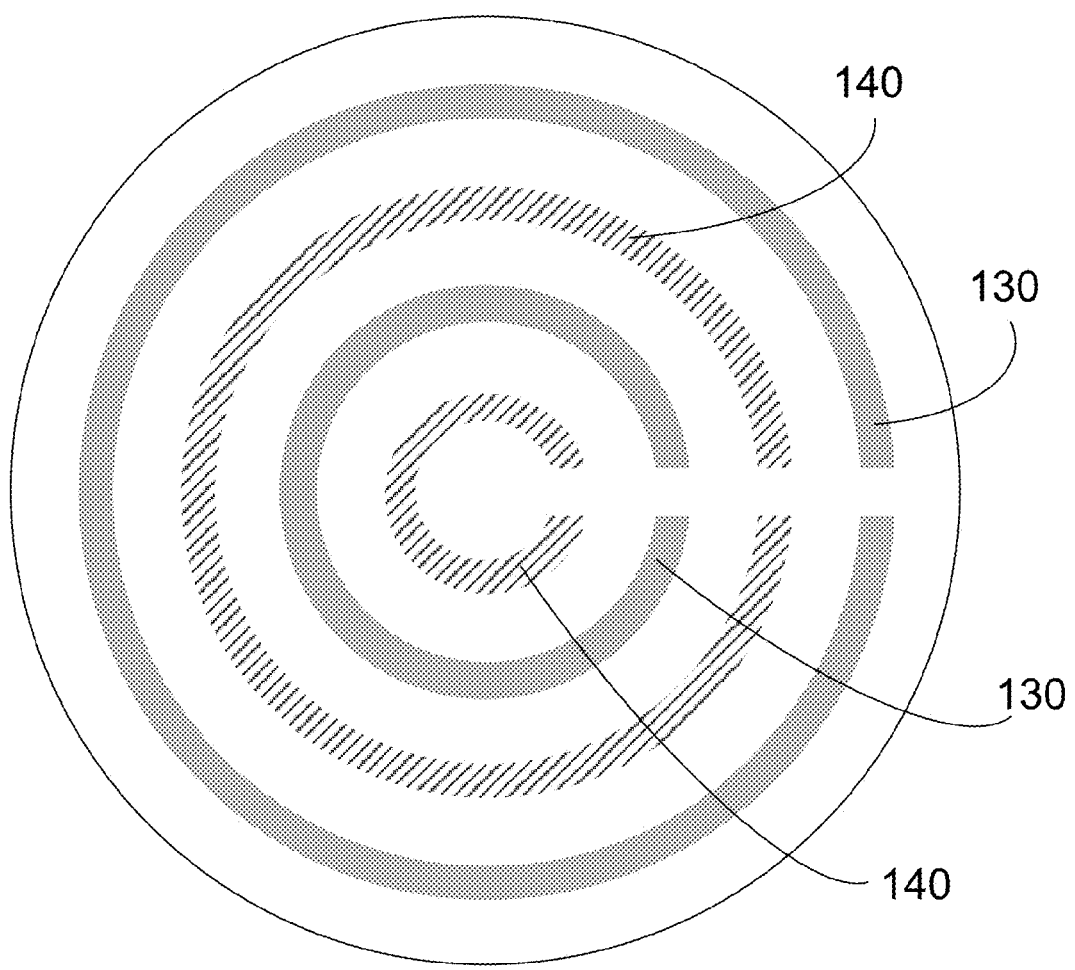
FIG. 13 depicts, in plan, a heat pipe according to an embodiment.
Figure 14:
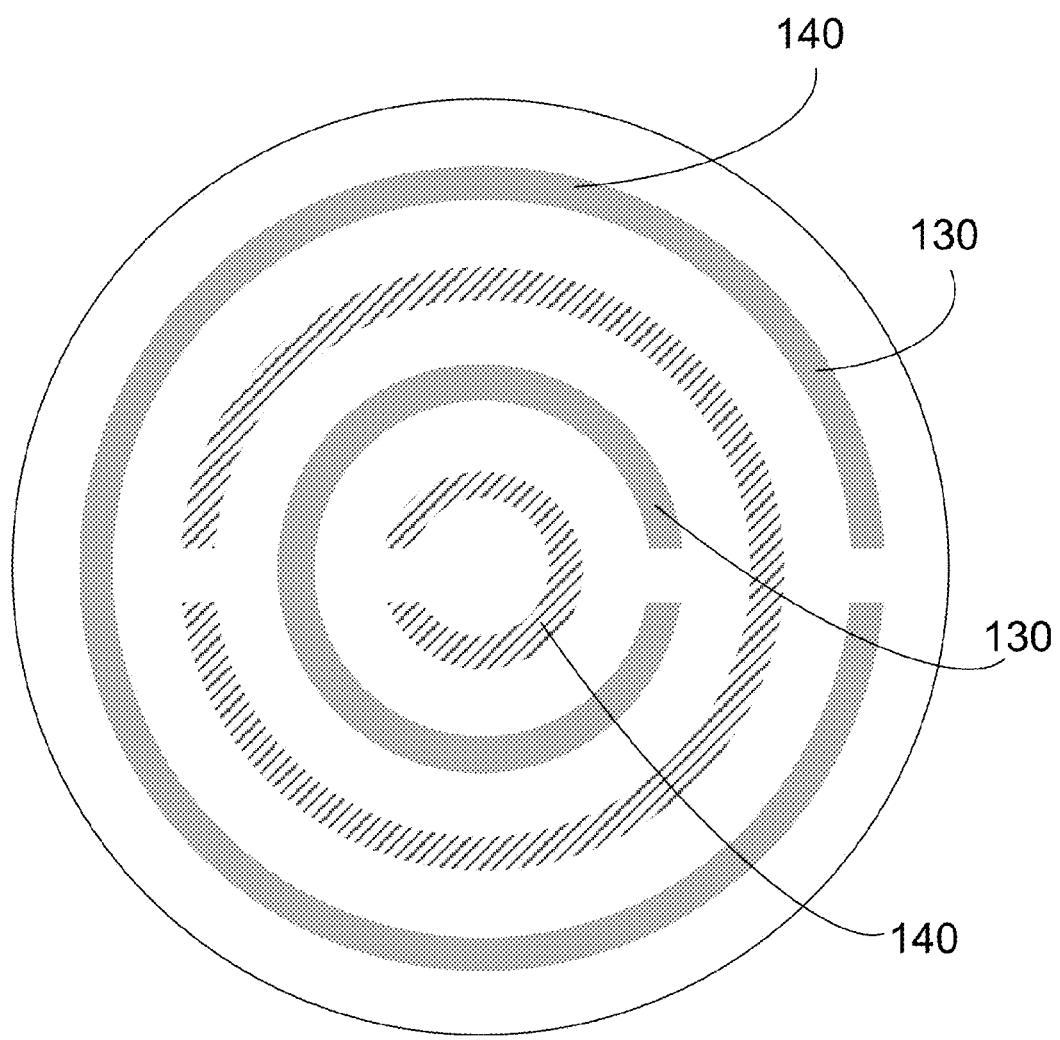
FIG. 14 depicts, in plan, a heat pipe according to an embodiment.
Figure 15:
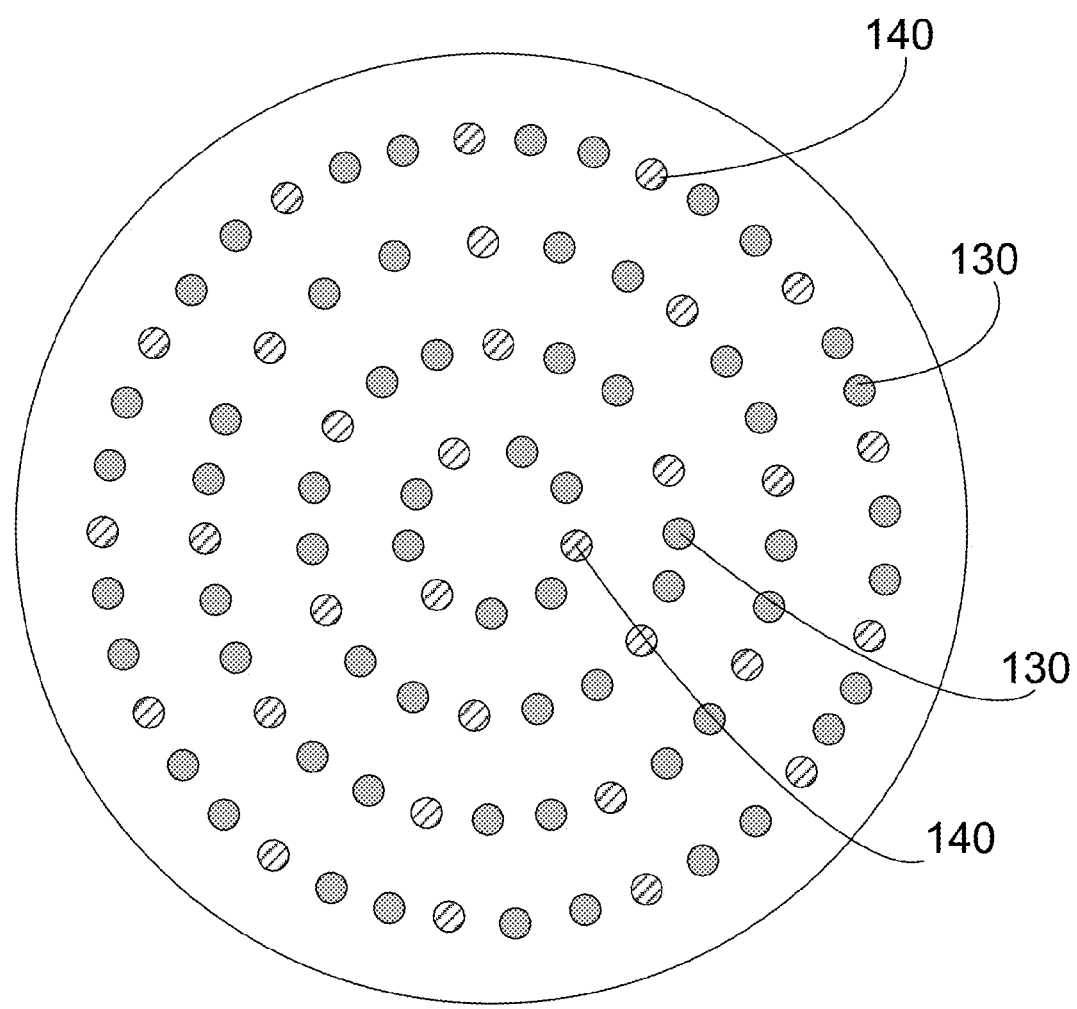
FIG. 15 depicts, in plan, a heat pipe according to an embodiment.

FIGS. 13-15 illustrate various embodiments, in plan, showing the form which structural member 140 and liquid transporter 130 may take. In FIGS. 13 and 14 both of those features take the form of a plurality of concentric rings. In the embodiment of FIG. 15, both of the features take the form of a plurality of columns arranged in concentric rings. Mixing of one of more features of one embodiment with one or more features of one or more other embodiments is possible as are other arrangements.

In order to help ensure the ease of flow of vapor within the vapor space 128, which leads to an efficient heat pipe, it may be necessary to provide one or more gaps extending the depth of the heat pipe 100 in the structural member 140 and liquid transporter 130. Such a gap is illustrated in FIGS. 13 and 14. In the embodiment of FIG. 13 gaps in each of the concentric rings line up. In the embodiment of FIG. 14 the gaps do not line up. However, the gaps are provided on alternate sides of the concentric rings. Other arrangements of gaps may be used. Alternatively or additionally, holes may be provided in the liquid transporter 130 and/or structural member 140 at the top ends close to the condensing surface 120 and/or at a position close to the liquid/vapor interface 192 and/or at a portion intermediate of those two locations and/or at the level of the reservoir 125.

In the embodiment of FIG. 15, the liquid transporter 130 is in the form of spaced apart members. In an embodiment the liquid transporter is in the form of columns. These columns are arranged in concentric circles, with a structural member 140 illustrated by diagonal cross hatching and the liquid transporter 130 illustrated by shading. The relative numbers and/or relative positions of the members of structural member 140 and/or liquid transporter 130 are illustrative only and the ratios and relative positions may vary considerably from what is illustrated in FIG. 15.

Figure 16:
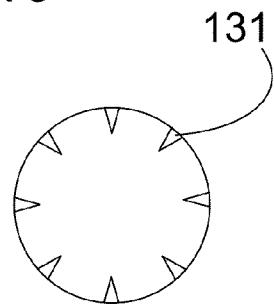
FIG. 16 depicts, in plan, an embodiment of a column illustrated in FIG. 15.
Figure 17:
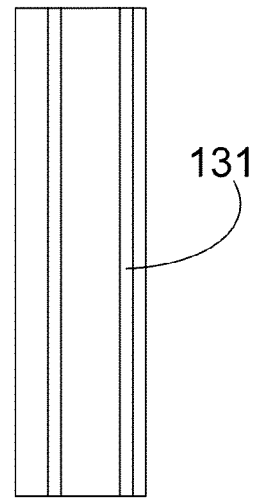
FIG. 17 is a side view of the column of FIG. 16.

FIG. 16 illustrates a column liquid transporter 130. In this case the liquid transporter 130 is not necessarily made of a porous material. Instead a plurality of grooves 131 are provided around the periphery of the column. The grooves are sized such that transport of liquid along the grooves under capillary action is possible. Although the column is illustrated as being circular in cross-section, this is not necessarily the case.

The structural member 140 may alternate with the liquid transporter 130. In one embodiment the liquid transporter 130 may be integrated into the structural member 140.

A balance is desirably achieved between the cross-sectional area of the structural member 140 and the liquid transporter 130 relative to the area of the heat pipe 100. The ratio should have a large enough cross-section to transport liquid from the condensing surface 120 to the reservoir 125 as well as providing sufficient stiffness to achieve structural integrity of the heat pipe 100.

The pressure inside the chamber 110 may deviate from the environmental pressure. A working fluid of the heat pipe may work at a pressure below or above atmospheric. Desirably the working fluid has a working pressure below atmospheric pressure. This is because this pressure will then help to close the chamber 110. In an embodiment, the pressure is as close as possible to atmospheric pressure.

Desirably the working fluid has an operating pressure at 22° C. at about atmospheric pressure. Desirably the working fluid has an evaporational energy (latent heat) as large as possible. Desirably the working fluid has a capillary pressure as large as possible so that it is maintained in the liquid transporter 130. Desirably the change in pressure per change in temperature is as large as possible so that control of the heating element 190a, 190b, 190c using the pressure sensor 197 is made easier. A typical range may be from 1-0.5 Pa/mK. A typical working fluid may be HFE 7000 produced by 3M. Other working fluids are also useable.

Figure 18:
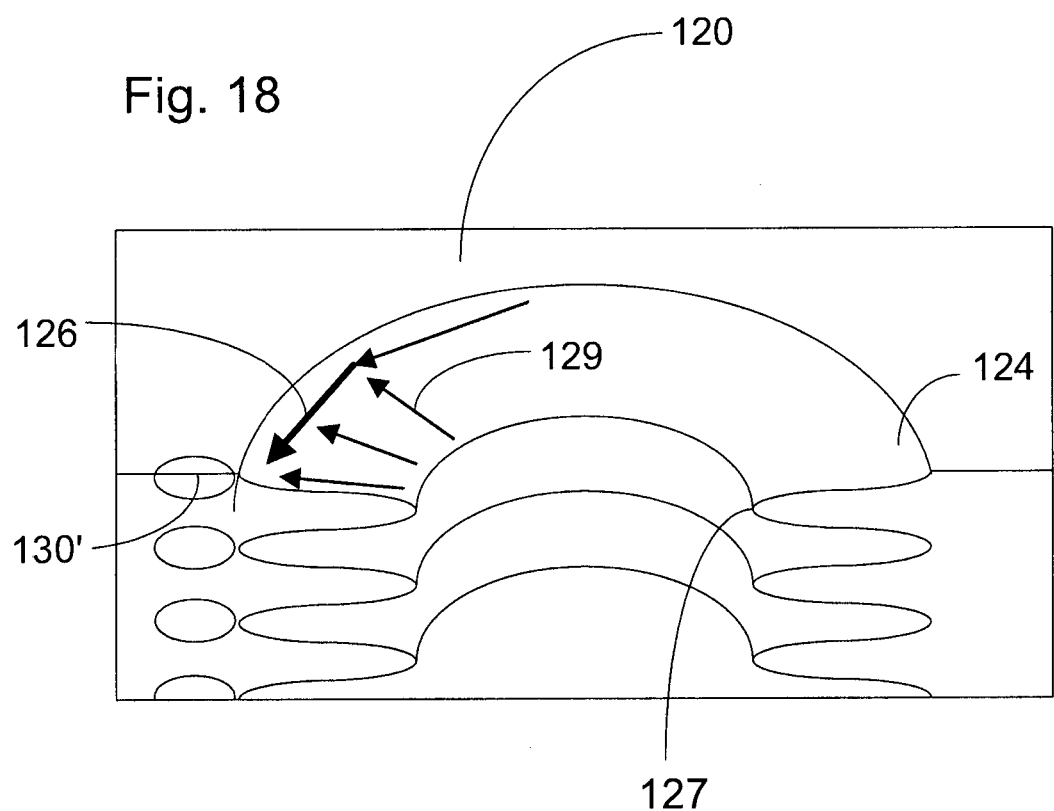
FIG. 18 depicts schematically a condensation surface shaped in two dimensions for applying a surface-tension drainage force to the condensate.

FIG. 18 illustrates a condensing surface 120 of a further embodiment. The condensing surface 120 of FIG. 18 may be applied to any embodiment, particularly the embodiments of FIGS. 6 and 7. The condensing surface 120 of FIG. 18 is particularly suited to those embodiments where liquid transporters 130 are discrete and provided in rows. For example, a cross section taken in the same direction as FIG. 6 but through a different portion could be taken where no liquid transporters 130 are present. In the embodiment of FIG. 18 the position on the condensing surface 120 where the top of a liquid transporter could be present is illustrated as position 130'.

The condensing surface 120 of FIG. 18 is arranged such that condensed liquid moves along it in two dimensions under surface-tension drainage forces. That is, the shape of the condensing surface 120 is curved in two directions such that surface-tension drainage forces act on the film of liquid on the condensing surface 120 in two directions. These two directions are illustrated by arrows in FIG. 18.

As with the embodiment of FIG. 6, the surface 120 is curved to transport liquid towards the liquid transporter 130. This curve is present in a groove 124 which results in the liquid moving in the groove 124 in direction 126 towards the liquid transporter 130.

The liquid is transported into the groove 124 from a ridge 127 which extends in the direction in which the cross-section of FIG. 6 is taken and is formed in a passage between two rows of liquid transporters 130. The sides of the ridge 127 are shaped to apply a surface-tension drainage force to liquid on the ridge 127 so that the liquid moves towards the bottom of the groove 124 where it can be moved to the liquid transporter 130. Thus, the direction 129 of liquid moving from the ridge 127 is substantially perpendicular to the direction in which liquid moves in the groove 124.

The curves of the groove 124 and the ridge 127 may be the same curves as described above. For example, the curves may have a so called Adamek profile.

Thus, it can be seen that the condensing surface 120 of the FIG. 18 embodiment is curved in two dimensions so that surface-tension drainage forces act in at least two different directions on liquid on the surface. The surface-tension drainage force on liquid may be in a single direction at one particular point on the condensing surface 120 but at a different location on the condensing surface 120 the direction of the surface-tension drainage force may be different. For example, the direction of the surface-tension drainage force in one location (e.g. in a groove 124) may be perpendicular to the surface-tension drainage force in another location (e.g. on a ridge 127).

Therefore, in the embodiment of FIG. 18 liquid collects in grooves 124 between the ridges 127. Therefore, the part of the condensing surface 120 which is available for condensation are the surfaces of the ridges 127.

Any feature described herein may be combined with any one or more other features herein as appropriate.

In an aspect, there is provided a lithographic apparatus comprising: a substrate holder for holding a substrate; and a heat pipe for maintaining the substrate holder at a uniform temperature, the heat pipe comprising: a chamber containing a liquid in a reservoir and a vapor in a vapor space; and a heating element at least partly in contact with liquid in the chamber. Desirably the apparatus further comprises a liquid transporter for applying a force to liquid thereby to transport liquid away from a condensing surface at least partly defining the chamber towards the reservoir. Desirably the heating element is positioned in the liquid transporter. Desirably the liquid transporter is a passive liquid transporter. Desirably the liquid transporter applies the force to the liquid by capillary action. Desirably the liquid transporter comprises a porous material. Desirably the liquid transporter is in the form of a plurality of projections extending towards the condensing surface from the reservoir. Desirably the projections are in the form of columns. Desirably the projections are in the form of a plurality of concentric rings. Desirably the projections comprise gaps for the passage of vapor therethrough. Desirably the apparatus further comprises a structural member extending between the condensing surface and a bottom wall of the chamber opposite the condensing surface. Desirably the structural member is in the form of a plurality of columns. Desirably the structural member is in the form of a plurality of concentric rings. Desirably the structural member comprises gaps for passage of vapor therethrough. Desirably the gaps are holes. Desirably the heating element is positioned at least partly within the reservoir. Desirably the heating element is elongate in a first direction and is positioned such that the first direction is substantially perpendicular to a top surface of liquid in the reservoir. Desirably the apparatus further comprises a porous member substantially covering a bottom wall of the chamber. Desirably the heating element is at least partly in the porous member substantially covering the bottom wall of the chamber. Desirably the heat pipe further comprises a temperature sensor, desirably in the vapor space or in the reservoir. Desirably the heat pipe further comprises a pressure sensor for measuring vapor pressure in the vapor space. Desirably the apparatus further comprises a controller for controlling the heating element. Desirably the controller controls the heating element to maintain the temperature and/or pressure within the chamber substantially constant. Desirably the heater is positioned outside of the reservoir. Desirably the apparatus is a photolithographic apparatus.

In an aspect, there is provided a heat pipe for maintaining an object at a uniform temperature, the heat pipe comprising: a chamber containing a liquid in a reservoir and a vapor in a vapor space, part of the chamber being defined by a condensing surface; a liquid transporter for applying a force to a liquid thereby to transport liquid away from the condensing surface towards the reservoir; and a heating element for heating liquid, the heating element being positioned in the liquid transporter.

In an aspect, there is provided a heat pipe for maintaining an object at a uniform temperature, the heat pipe comprising: a chamber containing a liquid in a reservoir and a vapor in a vapor space; and a heating element for heating liquid in the reservoir and positioned partly in the reservoir and partly in the vapor space. Desirably the heating element is elongate in a first direction and is positioned such that the first direction is substantially perpendicular to a top surface of liquid in the reservoir.

In an aspect, there is provided a heat pipe for maintaining an object at a uniform temperature, the heat pipe comprising: a chamber containing a liquid in a reservoir and a vapor in a vapor space, part of the chamber being defined by a condensing surface; and a liquid transporter for applying a force to a liquid thereby to transport liquid away from the condensing surface towards the reservoir; wherein the condensing surface has projections on it which project down towards the top of a liquid transporter. Desirably the condensing surface is curved such that its surface changes its angle smoothly from being horizontal at a position between adjacent liquid transporters to being at an angle to horizontal closer to the liquid transporters.

In an aspect, there is provided a lithographic apparatus comprising: a heat pipe for maintaining an object at a uniform temperature, wherein the heat pipe comprises: a chamber defining a liquid reservoir and a vapor space, part of the chamber being defined by a condensing surface; wherein the condensing surface is shaped such that accelerations of the object apply a force to liquid on the condensing surface to return the liquid to the liquid reservoir. Desirably the liquid is returned via a liquid transporter and the force is a force in the direction of the liquid transporter.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate table system, comprising:
    a substrate holder configured to hold a substrate; and
    a heat pipe configured to maintain the substrate holder at a substantially uniform temperature, the heat pipe comprising:
        a chamber containing a liquid reservoir and a vapor space; and
        a heating element at least partly in contact, in use, with liquid in the chamber, the heating element, in use, being substantially at or overlapping an interface between the liquid and the vapor in the chamber.

2. The substrate table system of claim 1, further comprising a liquid transporter configured to apply a force to liquid to transport liquid away from a condensing surface at least partly defining the chamber towards the reservoir.

3. The substrate table system of claim 2, wherein the heating element is positioned in the liquid transporter.

4. The substrate table system of claim 2, wherein the liquid transporter is a passive liquid transporter.

5. The substrate table system of claim 2, wherein the liquid transporter is configured to apply the force to the liquid by capillary action.

6. The substrate table system of claim 2, wherein the liquid transporter comprises a porous material.

7. The substrate table system of claim 2, wherein the liquid transporter is in the form of a plurality of projections extending towards the condensing surface from the reservoir.

8. The substrate table system of claim 1, further comprising a structural member extending between a condensing surface and a bottom wall of the chamber opposite the condensing surface.

9. The substrate table system of claim 1, wherein the heating element is positioned at least partly within the reservoir.

10. The substrate table system of claim 9, wherein the heating element is elongate in a first direction and is positioned such that the first direction is substantially perpendicular to a top surface of liquid in the reservoir.

11. The substrate table system of claim 1, further comprising a porous member substantially covering a bottom wall of the chamber.

12. The substrate table system of claim 11, wherein the heating element is at least partly in the porous member.

13. The substrate table system of claim 1, wherein the heat pipe further comprises a pressure sensor configured to measure vapor pressure in the vapor space.

14. The substrate table system of claim 1, wherein the heat pipe further comprises a temperature sensor.

15. The substrate table system of claim 14, further comprising a controller configured to control the heating element.

16. The substrate table system of claim 15, wherein the controller is configured to control the heating element to maintain the temperature and/or pressure within the chamber substantially constant.

17. The substrate table system of claim 1, wherein the heating element is positioned outside of the reservoir.

18. An apparatus, comprising:
    a substrate holder configured to hold a substrate;
    a heat pipe configured to maintain the substrate holder at a substantially uniform temperature, the heat pipe comprising:
        a chamber containing a liquid reservoir and a vapor space, and
        a heating element at least partly in contact, in use, with liquid in the chamber, the heating element, in use, being substantially at or overlapping an interface between the liquid and the vapor in the chamber;

a projection system configured to project a beam of radiation onto the substrate; and a liquid supply system configured to provide a liquid between the projection system and the substrate holder.

19. A method, comprising:

holding a substrate on a substrate holder; and maintaining the substrate holder at a substantially uniform temperature using a heat pipe, the heat pipe comprising a chamber containing a liquid and a vapor and a heating element at least partly in contact with the liquid in the chamber, the heating element being substantially at or overlapping an interface between the liquid and the vapor in the chamber.

20. The method of claim 19 further comprising providing liquid between a projection system and the substrate holder and projecting a beam of radiation, using the projection system, onto the substrate.

* * * * *